United States Patent [19]

Picanyol

[11] Patent Number: 5,252,824
[45] Date of Patent: Oct. 12, 1993

[54] ANALOG TRANSMITTER OF POSITION AND DIRECTION OF ROTATION HAVING A SIGNAL AMPLITUDE VARIES ON EACH CHANGE OF STATE OF SENSORS

[75] Inventor: Josep Picanyol, Caldes de Montbui, Spain

[73] Assignee: Schlumberger Industries, S.A., Montornes Del Valles, Spain

[21] Appl. No.: 913,098

[22] Filed: Jul. 14, 1992

[30] Foreign Application Priority Data

Jul. 24, 1991 [FR] France .................. 91 09380

[51] Int. Cl.$^5$ .................................. G01D 5/34
[52] U.S. Cl. .................. 250/231.13; 250/231.18; 73/861.77
[58] Field of Search ........... 250/231.13, 213.15, 250/231.11, 231.16, 231.18, 229, 281.14; 341/13, 10, 14; 356/28; 73/12, 861.77, 865.8, 864.18

[56] References Cited

U.S. PATENT DOCUMENTS

| | | | |
|---|---|---|---|
| 3,818,224 | 6/1974 | Schmidt | 250/231.16 |
| 4,037,157 | 7/1977 | Campbell | 250/231.16 |
| 4,334,222 | 6/1982 | Kelley et al. | 250/231.16 |
| 4,623,328 | 11/1986 | Hartranft | 250/231.16 |

FOREIGN PATENT DOCUMENTS 1105526  3/1968  United Kingdom .

*Primary Examiner*—David C. Nelms
*Assistant Examiner*—Que T. Le
*Attorney, Agent, or Firm*—Sanford J. Asman

[57] ABSTRACT

The invention relates to a device for encoding and remotely transmitting information concerning the position and the direction of rotation of a rotary element. This device comprises an encoder driven by sensors suitable for producing an analog signal whose amplitude varies on each change of state of each sensor by an amount that depends on which sensor changes state. The invention is applicable to electricity meters.

8 Claims, 2 Drawing Sheets

ANALOG TRANSMITTER OF POSITION AND DIRECTION OF ROTATION HAVING A SIGNAL AMPLITUDE VARIES ON EACH CHANGE OF STATE OF SENSORS

The present invention relates to device enabling position and direction of rotation of a rotary element to be detected, the device comprising a modulator constrained to rotate with the rotary element, and two sensors, each of which is capable of occupying a first state or a second state depending on whether or not it is influenced by the modulator, said two sensors changing state at least twice in different positions of the rotary element per complete revolution thereof.

BACKGROUND OF THE INVENTION

Devices of this type are described, for example, in the following U.S. Pat. Nos. 4,588,982, 4,655,359, and 4,827,123, and in general they are well known in the prior art.

Such devices are used, in particular, for encoding the position and the direction of rotation of the disks in electric energy meters (i.e. "electricity meters"), and they generally use optical techniques, with each of the sensors comprising a light emitter and a light receiver, and with the modulator being constituted by an optical shutter suitable for optically isolating the light receiver from the corresponding light emitter, or not isolating it as a function of the position of the shutter.

Nevertheless, there is a problem in the prior art, for example when there is the need to be able to transmit information concerning the position and the direction of rotation of the disk to a distant point for remote meter-reading purposes.

Since, in a digital representation, the information concerned can be encoded on two bits only, the transmission of said information requires, a priori, the use of serial or parallel digital data transmission methods, both of which are too complex for the application concerned.

In addition, any transmission to a remote point includes the risk of information being lost, and thus the need to verify transmission quality.

In this context, an object of the present invention is to provide a device that is very simple and that is capable of transmitting data representing the position and the direction of rotation of a rotary element in a manner that is reliable and cheap.

SUMMARY OF THE INVENTION

To this end, the device of the invention further includes an encoder for producing an analog output signal on an output having an amplitude that varies on each change of state of each sensor, the amount by which the amplitude of the analogue signal changes being dependent on which sensor is changing state and being different for each sensor.

Advantageously, in the main application of the device, the encoder is an essentially resistive network fed by a predetermined voltage and having a resistance that depends on the states of the sensors so as to produce an analog signal constituted by a current representing said states, and said current flows through a measurement resistor having a decoder connected across its terminals.

For example, the predetermined voltage may be provided by a voltage regulator disposed in the vicinity of the encoder and connected to a working potential by a first conductor, and the encoder may be connected to a reference voltage via a second conductor and said measurement resistor.

The amplitude of the analog signal represented by the current delivered by the encoder preferably has a non-zero minimum value so as to enable the associated electronics and sensors to be powered and also so as to make it possible to detect any break in the two-wire line constituting the first and second conductors.

The decoder may merely be constituted by a standard analog-to-digital converter, having logic means connected thereto (e.g. a microprocessor) suitable for emitting a fault signal whenever the amplitude of the analog signal as measured by said converter takes a value other than any of the values in a set of predetermined values, which values are constituted by the values normally taken by the amplitude of the analog signal, optionally together with values that differ therefrom by acceptable tolerance ranges.

BRIEF DESCRIPTION OF THE DRAWINGS

An embodiment of the invention is described by way of example with reference to the accompanying drawings, in which.

DETAILED DESCRIPTION

Figure 1:
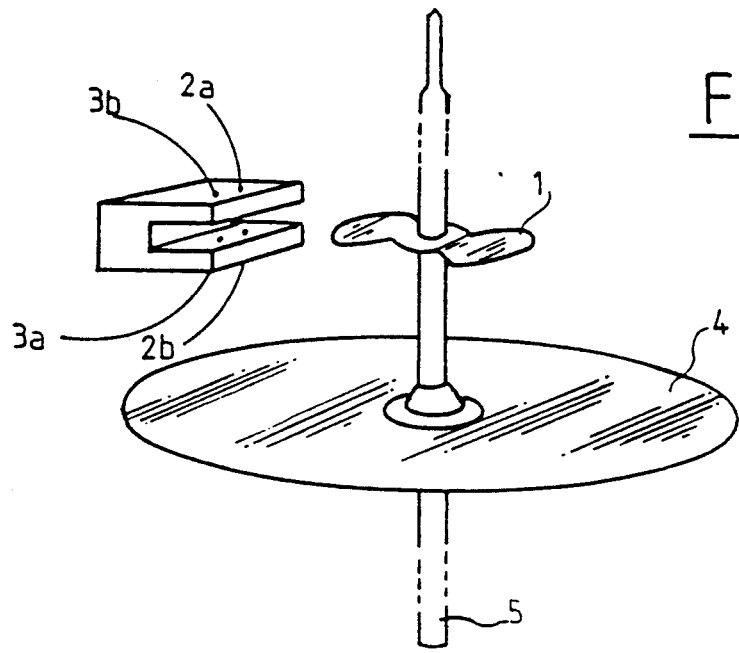
FIG. 1 is a fragmentary perspective view of an electric energy meter disk provided with a modulator and two sensors.

As shown in FIG. 1, the device of the invention comprises a modulator 1 associated with two sensors 2a, 2b and 3a, 3b for detecting rotation of a rotary element such as a disk 4 in an electric energy meter.

To this end, the modulator 1 which in this case is constituted by two diametrically-opposite 90° angular sectors, is constrained to rotate with the disk 4, e.g. by being mounted on the same shaft 5 as the disk.

Although depending on the intended application the sensors may be of various different kinds, and in particular they may be Hall effect cells, the sensors in the application described are preferably optical sensors, each comprising a light emitter such as 2a or 3a associated with a light receiver such as 2b or 3b, with the modulator then being constituted by an optical shutter and disposed, in operation, in such a manner as to pass between each emitter 2a, 3a and the corresponding receiver 2b, 3b, thereby interrupting the light beam passing from one to the other.

Each sensor, and more specifically each light receiver 2b, 3b takes up a first state or a second state, in each of which it delivers a signal representative of said state on an output 2s or 3s, depending on whether or not the sensor is influenced by the shutter 1, i.e. on whether or not it receives the light emitted by the corresponding light emitter 2a or 3a.

The sensors 2a, 2b and 3a, 3b are angularly offset from each other by an angle at the center of 45°, for example, and the shutter 1 is shaped and disposed in such a manner as to enable the sensors to change state at least twice (four times with the means shown) per complete rotation of the disk 4, at different angular positions of said disk.

More precisely, as shown in FIGS. 2a to 2d, the sensors are disposed in such a manner that both their respective light beams are intercepted by the shutter 1 when the shutter is at a certain position, that they both transmit light for another position of the shutter, and that in yet other positions of the shutter, one of the beams is intercepted while the other one is allowed to pass.

Figure 4:
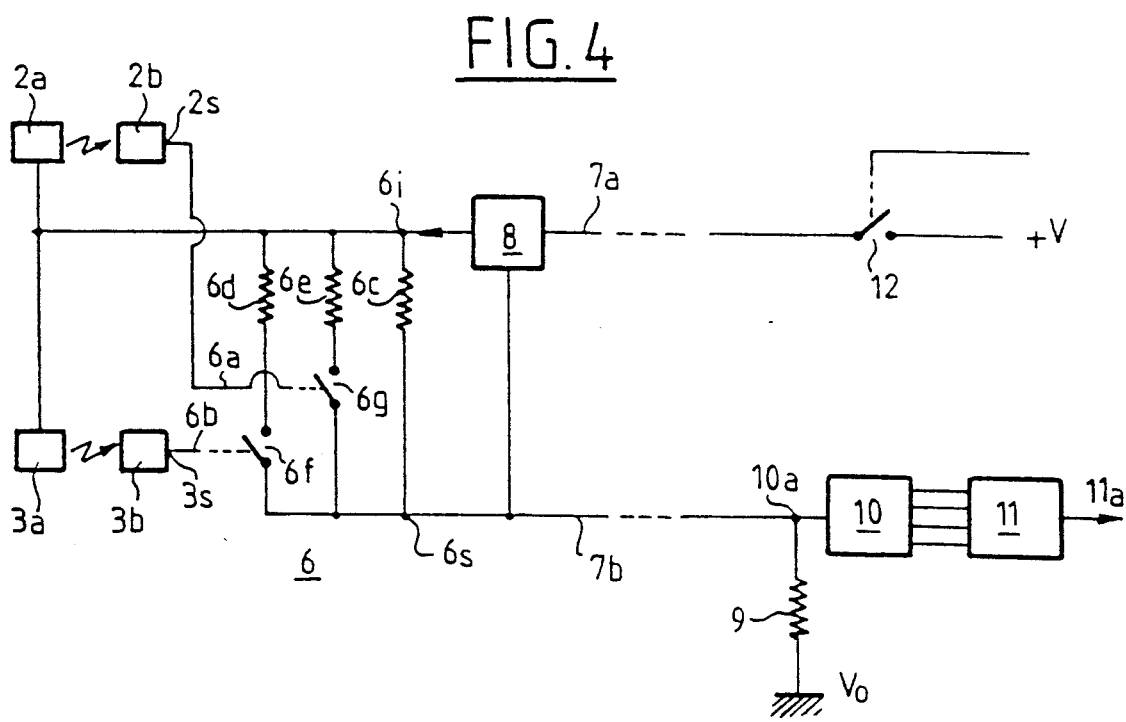
FIG. 4 is a diagram of a circuit suitable for the device of the invention.
Figures 2A, 2B, 2C, 2D:
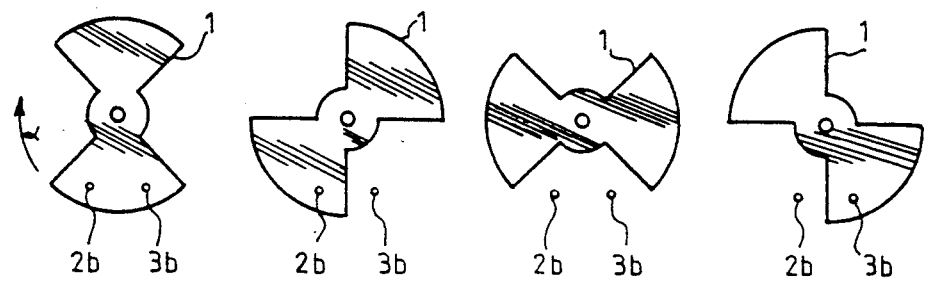
FIGS. 2a to 2d are diagrammatic plan views of the sensors and the modulator in various different positions of the modulator.

As shown in FIG. 4, the device also includes an encoder 6 suitable for producing current on an output 6s, where the magnitude of said current depends unambiguously on the states taken up by the sensors.

For example, the encoder may include an array of resistors 6c, 6d, 6e connected in parallel, and switches 6f and 6g connected to the outputs 2s and 3s of the light receivers 2b and 3b via corresponding conductors 6a and 6b, said switches being suitable for connecting or disconnecting the resistors 6d and 6e respectively, as a function of the states of the sensors 3a, 3b, and 2a, 2b.

The voltage across the terminals 6i, 6s of resistor 6c (and of the other resistors 6d and 6e, when they are connected) is set to a constant value by a voltage regulator 8 disposed in the vicinity of the encoder 6, and itself connected to a working potential +V via a first conductor 7a.

The current delivered by the encoder 6 at its output 6s is conveyed via a second conductor 7b to the first terminal of a resistor 9 whose other terminal is connected to a reference potential $V_O$.

The resistors 6d and 6e have different resistances selected so that the magnitude of the current delivered by the encoder 6 varies on each change of sensor state by an amount that depends on the sensor in question, in other words by an amount that differs from one sensor to the other.

The conductors 7a and 7b may constitute a two-wire line of relatively great length, e.g. several tens of meters.

The first terminal of resistor 9 is connected to the input 10a of a decoder 10 which is remote from the voltage regulator 8, and which is advantageously constituted by an analog-to-digital converter, thus receiving a voltage which is normally representative of the current delivered by the encoder 6.

The digital outputs of the decoder 10 are connected to logic means, e.g. a microprocessor 11, suitable for providing a fault signal on an output 11a in the event of the voltage across the terminals of the resistor 9 as measured by the decoder 10 taking a value that differs from all of the values that represent different values to be expected in normal operation of the device.

It is advantageous, in particular for the purpose of feeding the sensors, to ensure that the current delivered by the encoder 6 is never zero.

Figure 3:
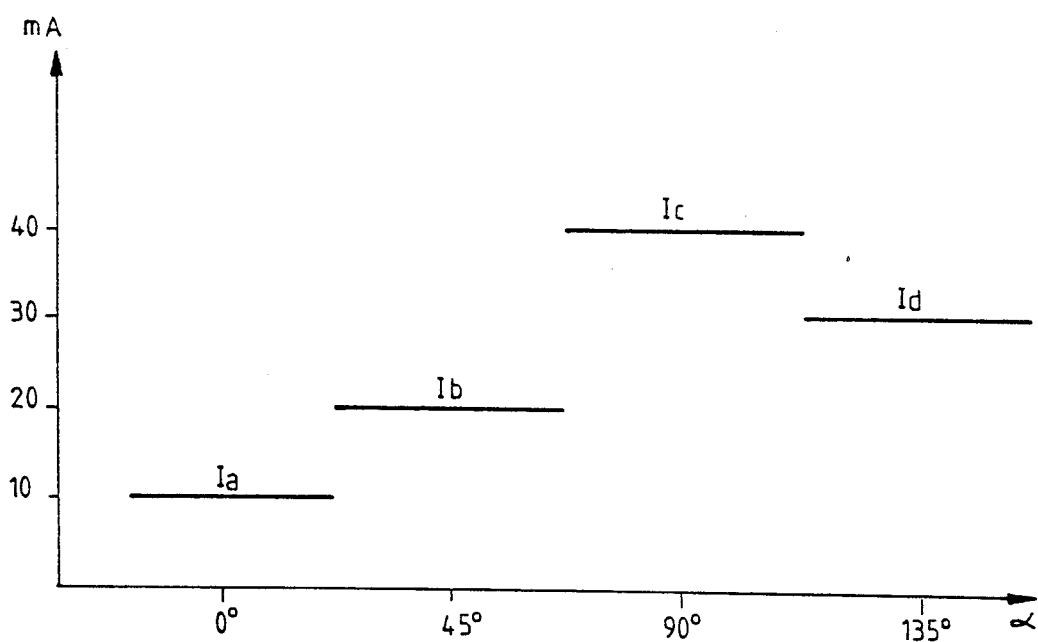
FIG. 3 shows the amplitude of the analog signal produced by the encoder for the various different angular positions alpha of the modulator, as shown in FIGS. 2a to 2d.

This characteristic is shown in FIG. 3 where each signal level is the level that should be obtained for a corresponding relative disposition of the shutter 1 and the sensors as shown in corresponding FIGS. 2a, 2b, 2c, and 2d.

Thus, when both light receivers 2b and 3b are deprived of light (FIG. 2a) the current Ia produced by the encoder 6 has a value of 10 mA, for example. When the first light receiver 2b is deprived of light (FIG. 2b) the current Ib produced by the encoder 6 has a value of 20 mA. When neither light receiver is deprived of light (FIG. 2c) the current Ic produced by the encoder 6 has a value of 40 mA. When only the second light receiver 3b is deprived of current (FIG. 2d), the current Id produced by the encoder 6 has a value of 30 mA, with each of the values Ia, Ib, Ic, and Id of the being associated with a corresponding and proportional value Va, Vb, Vc, and Vd of the voltage across the resistor 9.

In the conditions shown in FIG. 3, a change of state of the sensor 2a, 2b thus produces a positive or negative change of 20 mA in the current delivered to the resistor 9, whereas a change in state of the sensor 3a, 3b produces a positive or negative variation of only 10 mA, i.e. a variation that is different from the first variation.

To do this, the voltage established by the voltage regulator 8 between the input 6i and the output 6s of the encoder is therefore chosen in such a manner that the resistor 6c conveys a constant current of 10 mA, that the resistor 6f conveys a current of 10 mA or of 0 mA depending on whether or not it is connected, and that the resistor 6g conveys the current of 20 mA or of 0 mA, depending on whether or not it is connected.

Under the conditions described, the working voltage +V may vary over a wide range, e.g. 9 volts to 24 volts without having an effect on the operation of the device insofar as the voltage established across terminals of the encoder 6 by the regulator 8 is to a large extent independent of the working voltage +V, and is thus constant, at least so long as the working voltage is applied.

This characteristic makes it possible to detect possible faults in transmission even if there are variations in the voltage +V. In the example described, the values expected by the converter 10 are ideally proportional to 10 mA, 20 mA, 30 mA, and 40 mA, and in practice are proportional to said values plus or minus a few percent, in order to allow in particular for the limited accuracy with which the resistances of the resistors 6c, 6d, 6e, and 9 are defined. Nevertheless, obtaining any value that is significantly different serves to identify a possible anomaly, in particular a short circuit of the line if the current passing through the resistor 9 is too high, or an open circuit in the line if the current is zero or nearly zero.

As will be understood by the person skilled in the art on reading the above description, the direction of rotation of the disk is detected on the basis of the order in which the various different values of current flowing through the resistor 9 are detected.

Thus, the sequence Ia, Ib, Ic, Id (FIG. 3) designates rotation in the clockwise direction, as shown in FIGS. 2a to 2d, whereas the sequence Id, Ic, Ib, Ia indicates rotation in the opposite direction.

As suggested by the switch 12 in FIG. 4, the device of the invention need not be powered continuously, but may be powered periodically by closing the switch 12 at a frequency which is not less than twice the frequency at which states appear when the disk 4 is rotating at its maximum speed.

Under such circumstances, the voltage delivered by the regulator 8, although no longer constant in time, nevertheless maintains a value that is fixed and predetermined whenever it is indeed applied.

I claim:

1. A device enabling the position and the direction of rotation of a rotary element to be detected, the device comprising a modulator connected to rotate with the rotary element and two sensors, each of which is suitable for adopting a first state or a second state depending on whether or not it is being influenced by the modulator, said two sensors changing state at least twice per complete revolution of the rotary element, and at different positions thereof, wherein the device further includes an encoder for producing an analog output signal on an output having an amplitude that varies on each change of state of each sensor, the amount by which the amplitude of the analog signal changes being dependant on which sensor is changing state and being different for each sensor.

2. A device according to claim 1, wherein the encoder is an essentially resistive network fed by a predetermined voltage and having a resistance that depends on the states of the sensors so as to produce an analog signal constituted by a current representing said states, and wherein said current flows through a measurement resistor having a decoder connected across its terminals.

3. A device according to claim 1, wherein the predetermined voltage is provided by a voltage regulator disposed in the vicinity of the encoder and connected to a working potential by a first conductor, and wherein the encoder is connected to a reference voltage via a second conductor and said measurement resistor.

4. A device according to claim 1, wherein the amplitude of the analog signal has a non-zero minimum value.

5. A device according to claim 2, wherein said decoder is an analog-to-digital converter.

6. A device according to claim 5, further including logic means connected to said analog-to-digital converter and suitable for emitting a fault signal whenever the amplitude of the analog signal as measured by said converter takes a value that is different from any of the values in a set of predetermined values.

7. A device according to claim 1, wherein the rotary element is the disk of an electricity meter.

8. A device according to claim 7, wherein each of the sensors includes a light emitter and a light receiver, and wherein the modulator is an optical shutter suitable for optically isolating or not optically isolating the light receiver from the corresponding light emitter, as a function of its own position.

* * * * *